United States Patent
Lee et al.

(10) Patent No.: US 9,900,977 B2
(45) Date of Patent: Feb. 20, 2018

(54) ROLLABLE DISPLAY DEVICE

(71) Applicant: SAMSUNG DISPLAY CO., LTD., Yongin, Gyeonggi-Do (KR)

(72) Inventors: Jusuck Lee, Seoul (KR); Youn Joon Kim, Seoul (KR); Kyunghyun Baek, Suwon-si (KR); Yoonjee Shin, Ulsan (KR); Sangjo Lee, Hwaseong-si (KR); Junghun Lee, Hwaseong-si (KR); Kyungmin Choi, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 99 days.

(21) Appl. No.: 14/799,047

(22) Filed: Jul. 14, 2015

(65) Prior Publication Data

US 2016/0165717 A1 Jun. 9, 2016

(30) Foreign Application Priority Data

Dec. 3, 2014 (KR) .................. 10-2014-0172138

(51) Int. Cl.
| | | |
|---|---|---|
| *G06F 1/16* | (2006.01) | |
| *H05K 1/02* | (2006.01) | |
| *G09F 9/30* | (2006.01) | |
| *H04M 1/02* | (2006.01) | |
| *H05K 5/00* | (2006.01) | |
| *H05K 7/00* | (2006.01) | |

(52) U.S. Cl.
CPC .............. *H05K 1/028* (2013.01); *G06F 1/16* (2013.01); *G09F 9/301* (2013.01); *H04M 1/0268* (2013.01)

(58) Field of Classification Search
CPC ....... G06F 1/1601; G06F 1/1616; G09F 11/18
USPC ................ 361/679.21, 679.26, 679.27, 749; 40/515, 517
See application file for complete search history.

(56) References Cited

U.S. PATENT DOCUMENTS

| | | | | |
|---|---|---|---|---|
| 4,188,248 A | * | 2/1980 | Millgardh | ............... B32B 27/10 156/164 |
| 8,001,711 B2 | * | 8/2011 | LaFarre | .................. G02F 1/167 40/515 |
| 8,270,159 B2 | * | 9/2012 | Kao | .................... H04M 1/0268 345/169 |
| 2006/0107566 A1 | | 5/2006 | Van Rens | |
| 2014/0042293 A1 | | 2/2014 | Mok et al. | |

FOREIGN PATENT DOCUMENTS

| | | | |
|---|---|---|---|
| JP | 2004279774 A | * | 10/2004 |
| JP | 2013-127539 A | | 6/2013 |
| KR | 10-0818170 B1 | | 4/2008 |
| KR | 10-2008-0091145 A | | 10/2008 |

(Continued)

*Primary Examiner* — Binh Tran
(74) *Attorney, Agent, or Firm* — Lee & Morse, P.C.

(57) ABSTRACT

A rollable display device including a flexible display panel; a housing inside which the flexible display panel is rolled and accommodated; a first flexural member in the housing, the first flexural member contacting a first surface of the flexible display panel to bend the first surface; a second flexural member in the housing and spaced apart from the first flexural member in a first direction, the second flexural member contacting a second surface of the flexible display panel to bend the second surface; a reel core in the housing and the flexible display panel is rollable around a reel core.

17 Claims, 8 Drawing Sheets

(56) References Cited

FOREIGN PATENT DOCUMENTS

| KR | 10-2009-0026569 A | 3/2009 |
| KR | 10-2014-0028216 A | 3/2014 |
| KR | 10-2015-0095075 A | 8/2015 |

\* cited by examiner

ROLLABLE DISPLAY DEVICE

CROSS-REFERENCE TO RELATED APPLICATION

Korean Patent Application No. 10-2014-0172138, filed on Dec. 3, 2014, in the Korean Intellectual Property Office, and entitled: "Rollable Display Device," is incorporated by reference herein in its entirety.

BACKGROUND

1. Field

Embodiments relate to a rollable display device.

2. Description of the Related Art

As the market demand for flexible display devices continues to increase, various flexible display devices, such as a curved display device manufactured to have a specific curvature, a foldable display device curved with a specific radius curvature or bent with respect to a folding axis, a rollable display device rolled to a specific radius curvature, etc., have been considered.

SUMMARY

Embodiments are directed to a rollable display device.

The embodiments may be realized by providing a rollable display device including a flexible display panel that displays an image, the flexible display panel including a first surface and a second surface opposite to the first surface; a housing inside which the flexible display panel is rolled and accommodated; a first flexural member in the housing, the first flexural member contacting the first surface of the flexible display panel to bend the first surface; a second flexural member in the housing and spaced apart from the first flexural member in a first direction, the second flexural member contacting the second surface of the flexible display panel to bend the second surface; and a reel core in the housing and spaced apart from the first flexural member in the first direction such that the second flexural member is between the reel core and the first flexural member. The flexible display panel is rollable around the reel core.

Each of the first and second flexural members may have a substantially elliptical cylindrical shape that is elongated in a second direction, the second directly being substantially orthogonal to the first direction, a cross section of each of the first and second flexural members taken along a direction substantially parallel to the first direction may have a substantially elliptical shape, the cross section of the first flexural member may have a first long axis, and the cross section of the second flexural member may have a second long axis.

The first long axis may have a length smaller than a length of the second long axis.

The rollable display device may further include first rollers coupled with the first flexural member, the first rollers being spaced apart from each other in a direction of the first long axis of the first flexural member; and second rollers coupled with the second flexural member, the second rollers being spaced apart from each other in a direction of the second long axis of the second flexural member.

The first flexural member may be rotatable with respect to a rotational axis at a center of the first long axis, and the second flexural member may be rotatable with respect to a rotational axis at a center of the second long axis.

A distance between the center of the first long axis and the center of the second long axis may be greater than a sum of a half of the length of the first long axis and a half of the length of the second long axis.

The first and second flexural members may be rotatable such that the first and second long axes are substantially parallel to the first direction when the flexible display panel is exposed to the outside of the housing.

The rollable display device may further include a first restoring member coupled with the first flexural member, the first restoring member having an elasticity to rotate the first flexural member; and a second restoring member coupled with the second flexural member, the second restoring member having an elasticity to rotate the second flexural member, wherein the first and second flexural members are rotatable by the first and second restoring members rotate in response to the elasticity of the first and second restoring members such that the first and second long axes of the first and second flexural members are arranged substantially parallel to a third direction that is substantially orthogonal to the first and second directions when the flexible display panel is accommodated the housing.

The first and second flexural members may be rotatable in different directions.

The first flexural member may be rotatable about a rotational axis that is at a first end of the first long axis, and the second flexural member may be rotatable about a rotational axis that is at a second end of the second long axis.

The first long axis may have a length that is the same as a length of the second long axis.

A distance between the first end of the first flexural member and the second end of the second flexural member may be greater than the length of the first long axis.

The first and second flexural members may be rotatable in different directions.

The rollable display device may further include a first roller and a second roller, wherein the first flexural member includes a third end portion spaced apart from the first end portion in the first long axis direction, the second flexural member includes a fourth end portion spaced apart from the second end portion in the second long axis direction, the first roller is disposed at the third end portion and is coupled with the first flexural member, and the second roller is disposed at the fourth end portion and is coupled with the second flexural member.

The housing may include an opening therethrough to expose the flexible display panel to the outside thereof, and the first flexural member, the second flexural member, and the reel core may be sequentially arranged in a direction extending inwardly from the opening.

The rollable display device may further include a connection part connecting the flexible display panel to the reel core, wherein the image is not displayed in the connection part.

The connection part may be inside the housing when the flexible display panel is completely exposed at the outside of the housing.

The embodiments may be realized by providing a rollable display device including a flexible display panel that displays an image, the flexible display panel including a first surface and a second surface opposite to the first surface; a housing accommodating the flexible display panel, the housing including an opening therethrough; and a reel core in the housing, the first surface of the flexible display panel being rollable around the reel core, wherein the housing includes a first flexural part contacting the first surface of the flexible display panel to bend the flexible display panel, and a second flexural part contacting the second surface of the flexible display panel to bend the flexible display panel, and wherein the first flexural part, the second flexural part, and the reel core are sequentially arranged in a first direction extending inwardly from the opening.

The rollable display device may further include a first roller coupled with the first flexural part, the first roller being on a surface of the first flexural part and contacting the flexible display panel; and a second roller coupled with the second flexural part, the second roller being on a surface of the second flexural part and contacting the flexible display panel.

The rollable display device may further include a connection part connecting the flexible display panel to the reel core, wherein the image is not displayed in the connection part.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
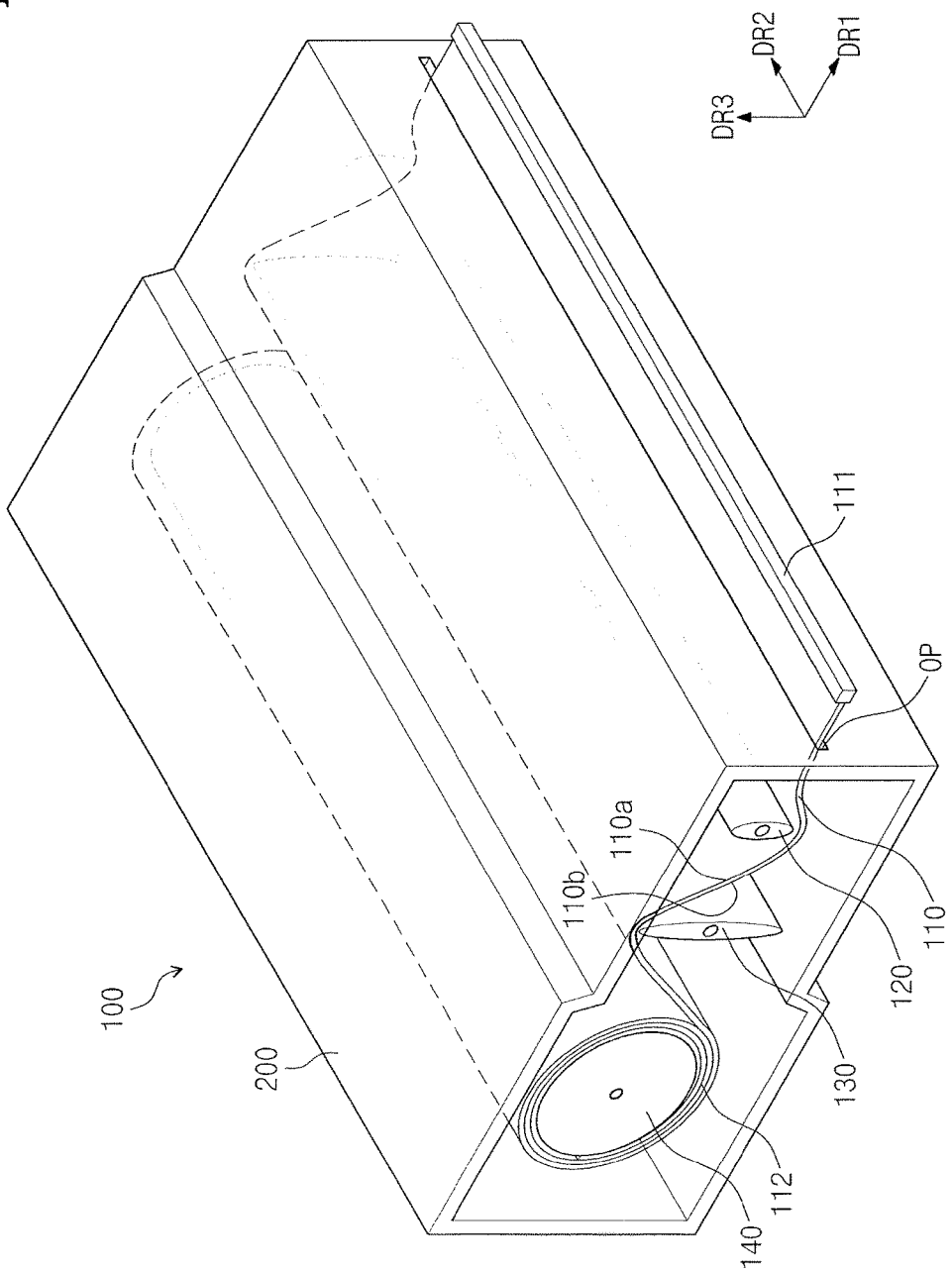
FIG. 1 illustrates a perspective view of a rollable display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a perspective view of a rollable display device 100 according to an exemplary embodiment.

Referring to FIG. 1, the rollable display device 100 may include a flexible display panel 100, a housing 200, a first flexural member 120, a second flexural member, and a reel core 140.

The flexible display panel 110 may display an image. A pixel serving as a minimum unit to display an image may be provided in a plural number in a display area of the flexible display panel 110. Each pixel may include at least one thin film transistor.

The flexible display panel 110 may have a first surface 110a and a second surface 110b opposite to the first surface 110a. The flexible display panel 110 may be rolled and kept or accommodated inside the housing 200.

The flexible display panel 110 may be connected to a grip part 111. When an external force is applied to the grip part 111 to pull the grip part 111, the flexible display panel 110 may come out of the housing 200 along with the grip part 111, and may be exposed to the outside of the housing 200.

The housing 200 may include an opening OP formed therethrough to expose the flexible display panel 110, e.g., to allow the flexible display panel 110 to pass from inside of the housing 200 to outside of the housing 200. The opening OP may extend along a second direction DR2. For example, the flexible display panel 110 may be exposed to the outside of the housing 200 after passing through the opening OP.

The first flexural member 120, the second flexural member 130, and the reel core 140 may be disposed in or contained within the housing 200. In an implementation, the reel core 140 may be elastically biased to retract the flexible display panel 110 back into the housing 200.

The first flexural member 120 may be spaced apart from the second flexural member 130 in a first direction DR1. The reel core 140 may be spaced apart from the first flexural member 120 in the first direction DR1. For example, the second flexural member 130 may be between the first flexural member 120 and the reel core 140.

Each of the first flexural member 120, the second flexural member 130, and the reel core 140 may extend in the second direction DR2 (e.g., substantially perpendicular or orthogonal to the first direction DR1). Each of the first flexural member 120 and the second flexural member 130 may have a substantially elliptical cylindrical shape, and the reel core 140 may have a substantially cylindrical shape elongated in the second direction DR2.

In an implementation, each of the first flexural member 120 and the second flexural member 130 may have an elliptical cylindrical shape. In an implementation, each of the first flexural member 120 and the second flexural member 130 may have a substantially cylindrical shape, or each of the first flexural member 120 and the second flexural member 130 may have a shape in which only surfaces making contact with the flexible display panel 110 have a curvature.

The first flexural member 120 may contact the first surface 110a of the flexible display panel 110 to bend the flexible display panel 110, and the second flexural member 130 may contact the second surface 110b of the flexible display panel 110 to bend the flexible display panel 110. Accordingly, the flexible display panel 110 may be bent in a wave shape along the first direction DR1 in the housing 200. When the flexible display panel 110 is bent in the wave shape (without being rolled in one direction), deformation of the flexible display panel 110 may be prevented when the flexible display panel 110 is rolled and accommodated in the housing 200.

If the flexible display panel 110 were to be kept inside the housing 200 after being rolled in one direction, stress could be applied to flexible display panel 110 in the one direction. Thus, if the flexible display panel 110 were to be kept inside the housing 200 for a long time without use, the flexible display panel 110 could be deformed in the rolled shape. However, according to the present exemplary embodiment, the first surface 110a may be concavely curved by the first flexural member 120 and the second surface 110b may be concavely curved by the second flexural member 130. For example, the flexible display panel 110 may be accommodated inside the housing 200 in the wave shape. Thus, even if the flexible display panel 110 were to be kept inside the housing 200 for a long time without use, defects in the rolled shape of the flexible display panel 110, which could otherwise be caused when the flexible display panel 110 is rolled in one direction, may be reduced and/or prevented.

Figure 2:
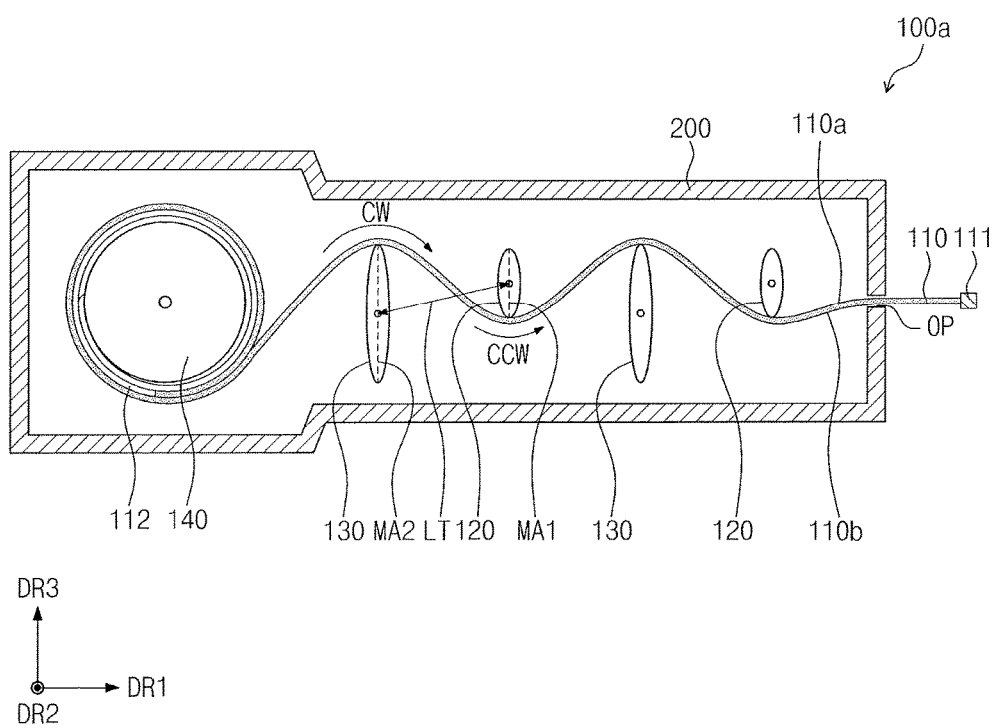
FIG. 2 illustrates a cross-sectional view of a rollable display device according to another exemplary embodiment.

FIG. 2 illustrates a cross-sectional view of a rollable display device 100a according to another exemplary embodiment. In FIG. 2, the same reference numerals denote the same elements in FIG. 1, and thus detailed descriptions of the same elements may be omitted.

Referring to FIG. 2, the rollable display device 100a may include a flexible display panel 110, a housing 200, a plurality of first flexural members 120, a plurality of second flexural members 130, and a reel core 140.

According to the present exemplary embodiment, the first flexural members 120 may be alternately arranged with the second flexural members 130. In an implementation, two first flexural members 120 and two second flexural members 130 may be included, or the number of the first and second flexural members 120 and 130 may be other than two.

The first flexural members 120 may contact the first surface 110a to bend the flexible display panel 110, and the second flexural members 130 may contact the second surface 110b to bend the flexible display panel 110. For example, the flexible display panel 110 shown in FIG. 2 is bent more times than the flexible display panel 110 shown in FIG. 1. Accordingly, even if the flexible display panel 110 were to be kept inside the housing 200 for a long time without use, deformation of the flexible display panel 110 may be prevented.

In the present exemplary embodiment, a cross-sectional surface of each of the first and second flexural members 120 and 130, in a direction substantially parallel with the first direction DR1, may have an elliptical shape. The cross-sectional surface of the first flexural member 120 has a first long axis MA1, and the cross-sectional surface of the second flexural member 130 has a second long axis MA2. In an implementation, the first long axis MA1 may have a length that is longer than that of the second long axis MA2. In an implementation, the length of the first long axis MA1 may be substantially equal to the length of the second long axis MA2.

The first flexural member 120 may rotate (e.g., may be rotatable) with respect to a rotational axis crossing or at a center of the first long axis MA1, and the second flexural member 130 may rotate (e.g., may be rotatable) with respect to a rotational axis crossing or at a center of the second long axis MA2. A distance LT between the centers of the first and second flexural members 120 and 130 that are adjacent to each other may be greater than a sum of a half of the length of the first long axis MA1 and a half of the length of the second long axis MA2. Accordingly, when the flexible display panel 110 is exposed to the outside of the housing 200 or rolled into the housing 200, the flexible display panel 100 may be prevented from being stuck between the first and second flexural members 120 and 130.

In an implementation, the first long axis MA1 may be shorter than the second long axis MA2, and a length of the housing 200 in the first direction DR1 may be reduced. Therefore, the housing 200 may be small and compact, and deformation of the flexible display panel 110 may be prevented when kept in the rolled shape.

The first and second flexural members 120 and 130 may include, e.g., a plastic material, a metal material, or a rubber material. In an implementation, the first and second flexural members 120 and 130 may be coated with a coating material to help reduce friction with respect to the flexible display panel 110.

When the flexible display panel 110 is rolled and kept inside or accommodated in the housing 200, e.g., in a non-viewing state, the first and second long axes MA1 and MA2 may be substantially parallel with a third direction DR3 (which third direction is substantially perpendicular or orthogonal to the first and second directions DR1 and DR2). In an implementation, when the flexible display panel 110 is rolled and kept inside the housing 200, the first and second long axes MA1 and MA2 may be disposed in a direction substantially parallel with the third direction DR3.

Figure 3:
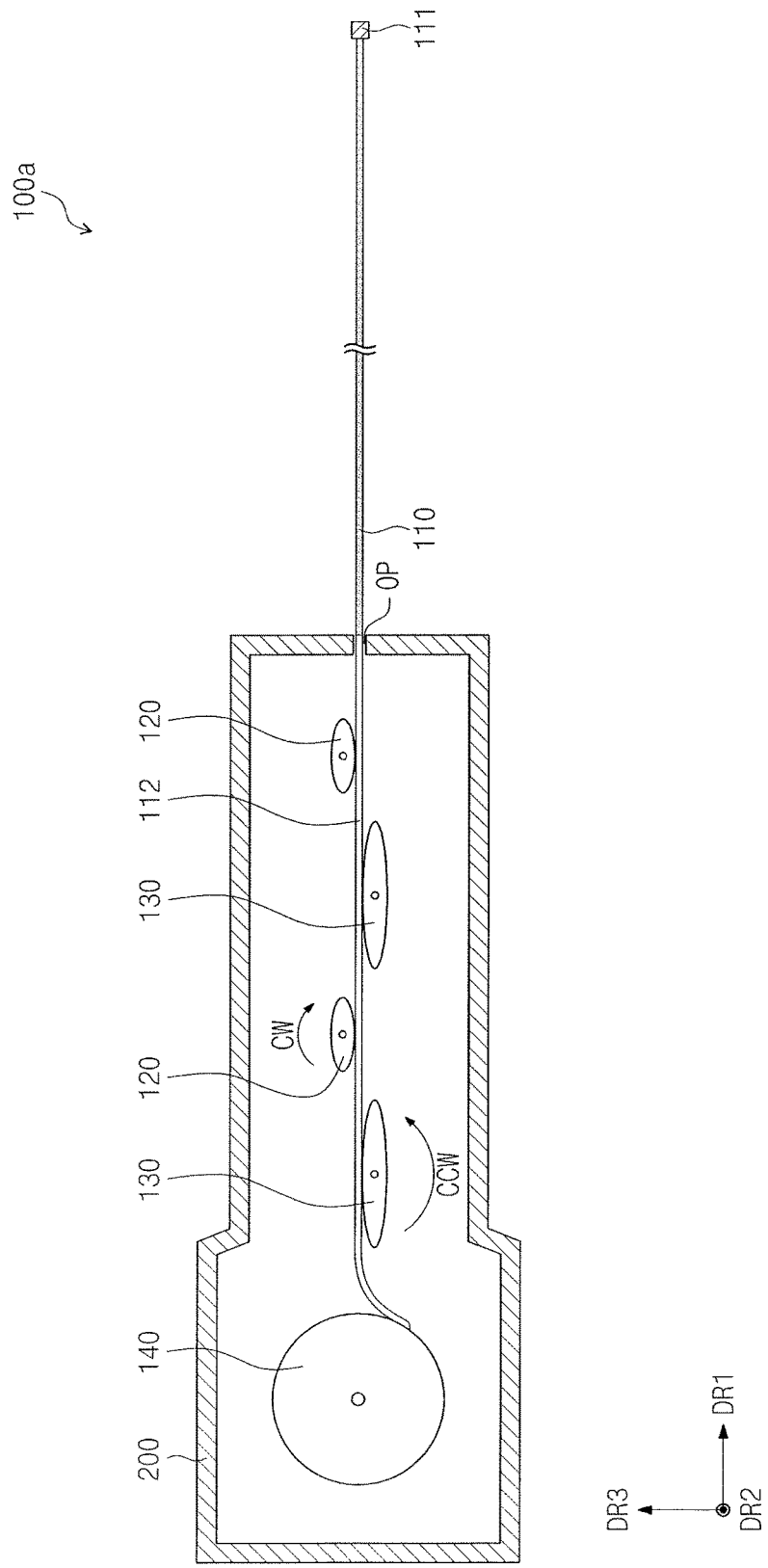
FIG. 3 illustrates a sectional view showing an operation of the rollable display device of FIG. 2.

FIG. 3 illustrates a view showing an operation of the rollable display device shown in FIG. 2. In FIG. 3, the same reference numerals denote the same elements in FIG. 2, and thus detailed descriptions of the same elements may be omitted.

FIG. 3 illustrates rollable display device in which the flexible display panel 110 is exposed to the outside of the housing 200, e.g., during use such that the flexible display panel displaying an image is viewable by a user. When the flexible display panel 110 is exposed to the outside of the housing, the first and second flexural members 120 and 130 may rotate (e.g., may be rotatable) such that the first and second long axes MA1 and MA2 may be substantially parallel to the first direction DR1. For example, if the first and second flexural members 120 and 130 were not rotatable, the first and second flexural members 120 and 130 could serve as or provide undesirable resistance when the flexible display panel 110 is pulled out to the outside of the housing 200. However, according to the present exemplary embodiment, the first and second flexural members 120 and 130 may be rotatable, and the flexible display panel 110 may be easily exposed to the outside of the housing 200.

In an implementation, the first flexural members 120 may rotate in a counter-clockwise direction CCW and the second flexural member 130 may rotate in a clockwise direction CW (refer to FIGS. 2 and 3) when the flexible display panel 110 is exposed to the outside of the housing 200. In an implementation, when the flexible display panel 110 is rolled into the housing 200, the first flexural members 120 may rotate in the clockwise direction CW and the second flexural member 130 may rotate in the counter-clockwise direction CCW.

The first and/or second flexural members 120 and 130 may be rotated in the counter-clockwise direction CCW or the clockwise direction CW (refer to FIGS. 2 and 3) by the external force used to pull out the flexible display panel 110, and/or may be rotated in the clockwise direction CW or the counter-clockwise direction CCW by a first restoring member RB1 (refer to FIG. 4A) and a second restoring member RB2 (refer to FIG. 4B), which have elasticity.

The first and second restoring members RB1 and RB2 (refer to FIGS. 4A and 4B) may have elasticity. The first restoring member RB1 may be connected to the first flexural member 120 and the second restoring member RB2 may be connected to the second flexural member 130.

In an implementation, the first and second restoring members RB1 and RB2 (refer to FIGS. 4A and 4B) may be, e.g., a plate-shaped spring. The first restoring member RB1 (refer to FIG. 4A) may be disposed in the rotational axis of the first flexural member 120, and the second restoring member RB2 (refer to FIG. 4B) may be disposed in the rotational axis of the second flexural member 130. For example, when the first and/or second flexural members 120 and 130 are rotated in the counter-clockwise direction CCW or the clockwise direction CW (refer to FIGS. 2 and 3) by the external force, the first and/or second restoring members RB1 and RB2 (refer to FIGS. 4A and 4B) may be contracted. When the flexible display panel 110 is inserted or returned into the housing 200, the contracted first and second restoring members RB1 and RB2 (refer to FIGS. 4A and 4B) may be expanded again. Due to the elasticity of the expanded first and second restoring members RB1 and RB2 (refer to FIGS. 4A and 4B), the first and/or second flexural members 120 and 130 may be rotated in the clockwise direction CW or the counter-clockwise direction CCW.

The rollable display device 100a may further include a connection part 112 that connects the flexible display panel 110 to the reel core 140. The connection part 112 may not display the image. The connection part 112 may be rolled around the reel core 140. The connection part 112 may include, e.g., at least one of polycarbonate (PC), polyethylene terephthalate (PET), polyethylene (PE), polypropylene (PP), polysulfone (PSF), polymethylmethacrylate (PMMA), triacetylcellulose (TAC), cyclo-olefin polymer (COP), and cyclo-olefin copolymer (COC).

In an implementation, the connection part 112 may surround the reel core 140. In an implementation, the reel core 140 may include a coupling recess and the connection part 112 may be coupled to the coupling recess.

Figure 4A:
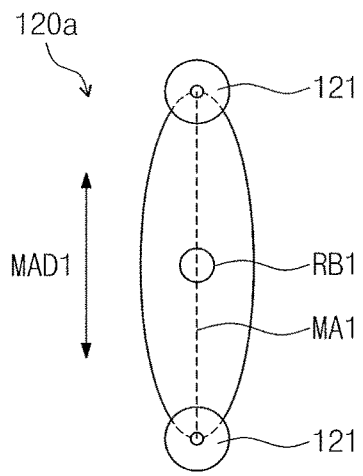
FIG. 4A illustrates a cross-sectional view of a first flexural member according to another exemplary embodiment.
Figure 4B:
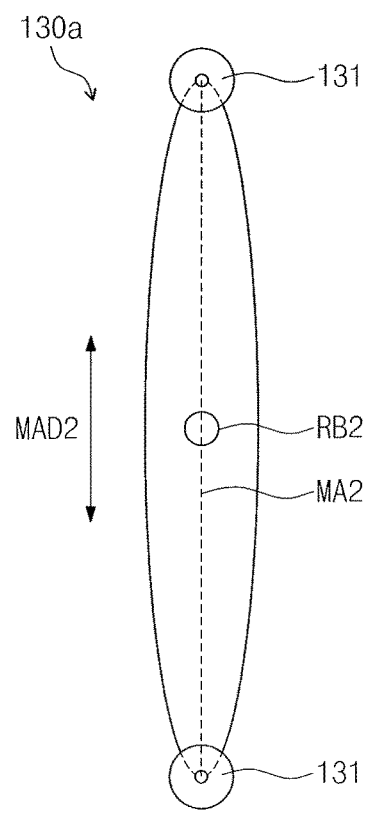
FIG. 4B illustrates a cross-sectional view of a second flexural member according to another exemplary embodiment.

FIG. 4A illustrates a cross-sectional view of a first flexural member 120a according to another exemplary embodiment. FIG. 4B illustrates a cross-sectional view of a second flexural member 130a according to another exemplary embodiment. In FIGS. 4A and 4B, the same reference numerals denote the same elements in FIG. 2, and thus detailed descriptions of the same elements may be omitted.

Referring to FIGS. 4A and 4B, first rollers 121 may be coupled to the first flexural member 120a. The first rollers 121 may be spaced apart from each other in a direction MAD1 of the first long axis MA1. Second rollers 131 may be coupled to the second flexural member 130a. The second rollers 131 may be spaced apart from each other in a direction MAD2 of the second long axis MA2.

Each of the first rollers 121 may have a substantially cylindrical shape elongated in the second direction DR2, and each of the second rollers 131 may have a substantially cylindrical shape elongated in the second direction DR2.

The first and second rollers 121 and 131 may contact the flexible display panel 110 (refer to FIG. 2). When the flexible display panel 110 (refer to FIG. 2) moves, the first and second rollers 121 and 131 may rotate. When first and second rollers 121 and 131 are rotated, a frictional force between the flexible display panel 110 (refer to FIG. 2) and each of the first and second rollers 121 and 131 may be reduced, and thus the flexible display panel 110 (refer to FIG. 2) may be easily exposed to the outside of the housing 200 (refer to FIG. 2).

Figure 5:
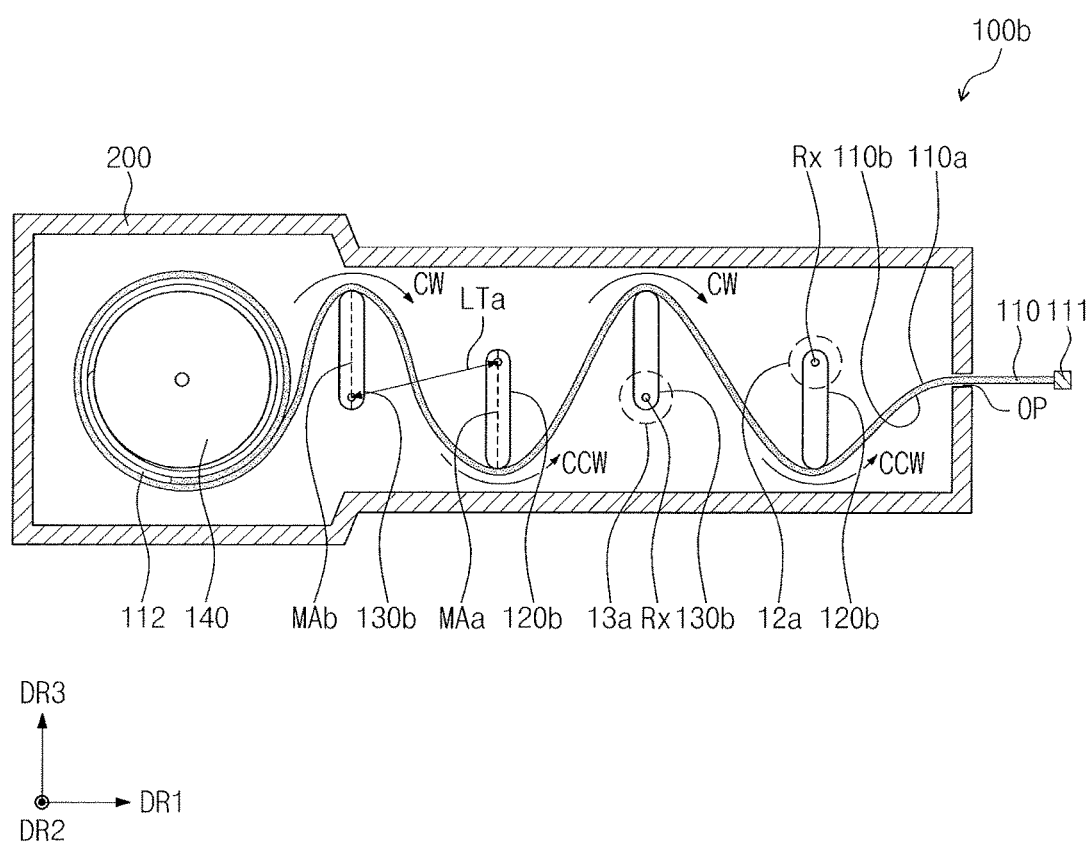
FIG. 5 illustrates a cross-sectional view of a rollable display device according to another exemplary embodiment.
Figure 6:
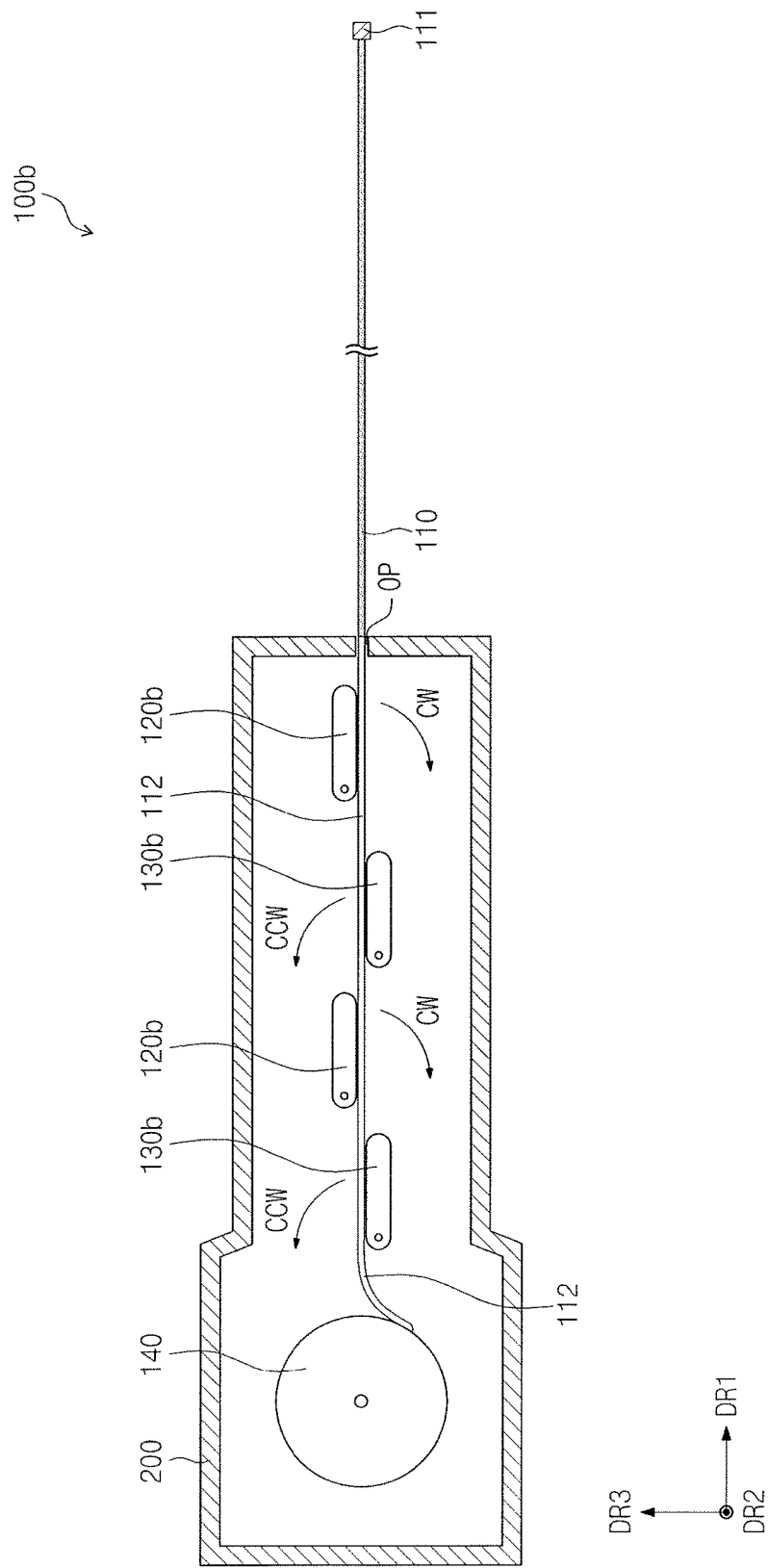
FIG. 6 illustrates a sectional view of an operation of the rollable display device shown in FIG. 5.

FIG. 5 illustrates a cross-sectional view of a rollable display device 100b according to another exemplary embodiment. FIG. 6 illustrates a view showing an operation of the rollable display device 100b shown in FIG. 5. In FIGS. 5 and 6, the same reference numerals denote the same elements in FIG. 2, and thus detailed descriptions of the same elements may be omitted.

Referring to FIGS. 5 and 6, the rollable display device 100b may include a flexible display panel 110, a housing 200, a first flexural member 120b, a second flexural member 130b, and a reel core 140.

Hereinafter, one end portion of a first long axis MAa of the first flexural member 120b is referred to as a first end portion 12a, and one end portion of a second long axis MAb of the second flexural member 130b is referred to as a second end portion 13a. In an implementation, the first flexural member 120b may rotate with respect to a rotational axis RX coupled to or at the first end portion 12a, and the second flexural member 130b may rotate with respect to a rotational axis RX coupled to or at the second end portion 13a.

In an implementation, the first flexural member 120b may rotate in a direction different from, e.g., opposite to, a direction in which the second flexural member 130b is rotated. For example, when the flexible display panel 110 is exposed to the outside of the housing 200, e.g., as the flexible display panel 110 is being pulled from the housing 200, the first flexural member 120b may be rotated in a counter-clockwise direction CCW and the second flexural member 130b may be rotated in a clockwise direction CW. In an implementation, when the flexible display panel 110 is rolled into the housing 200, e.g., as the flexible display panel 110 is being returned to the housing 200, the first flexural member 120b may be rotated in the clockwise direction CW and the second flexural member 130b may be rotated in the counter-clockwise direction CCW.

In an implementation, the first long axis MAa may have a length that is substantially the same as a length of the second long axis MAb. The first and second flexural members 120b and 130b may be rotated in different directions from each other, and a distance LTa between a center of the first flexural member 120b and a center of the second flexural member 130b may be longer than the length of the first long axis MAa or the length of the second long axis MAb. Accordingly, the flexible display panel 110 may be prevented from being stuck between the first and second flexural members 120b and 130b when the flexible display panel 110 is exposed to the outside of the housing 200 or rolled into the housing 200.

If the first and second flexural members 120b and 130b were to be rotated in the same direction, a distance LTa between the rotational axis RX of the first flexural member 120b and the rotational axis RX of the second flexural member 130 would need to be greater than a sum of the length of the first long axis MAa and the length of the second long axis MAb. To this end, a length in the first direction DR1 of the housing 200 could become excessively long or large. However, according to the present exemplary embodiment, the first and second flexural members 120b and 130b may be rotated in different or opposite directions from each other, and the distance LTa between the rotational axis RX of the first flexural member 120b and the rotational axis RX of the second flexural member 130b is enough to be greater than the length of the first long axis MAa or the length of the second long axis MAb. Therefore, deformation of the flexible display panel 110 while in the rolled shape may be prevented, and the housing 200 may be small in size.

Figure 7A:
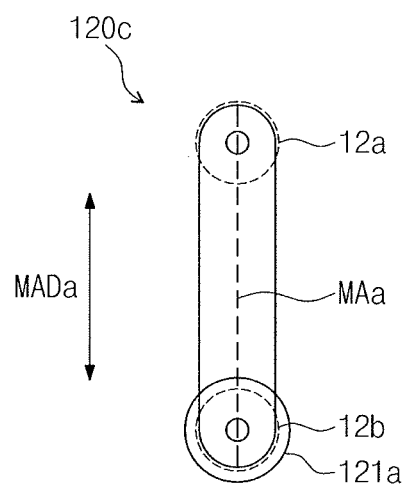
FIG. 7A illustrates a cross-sectional view of a first flexural member according to another exemplary embodiment.
Figure 7B:
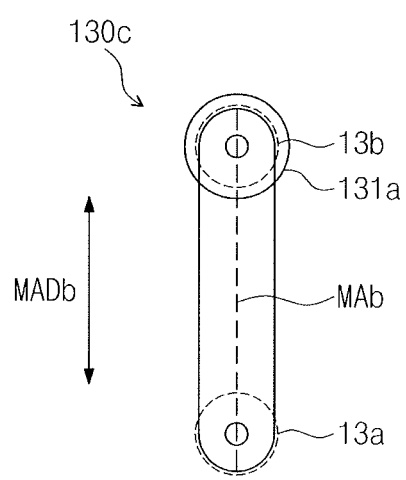
FIG. 7B illustrates a cross-sectional view of a second flexural member according to another exemplary embodiment.

FIG. 7A illustrates a cross-sectional view of a first flexural member 120c according to another exemplary embodiment. FIG. 7B illustrates a cross-sectional view of a second flexural member 130c according to another exemplary embodiment. In FIGS. 7A and 7B, the same reference numerals denote the same elements in FIG. 5, and thus detailed descriptions of the same elements may be omitted.

Referring to FIGS. 7A and 7B, a first roller 121a may be coupled to the first flexural member 120c and a second roller 131a may be coupled to the second flexural member 130c.

A first end portion 12a and a third end portion 12b are defined at both, e.g., opposite, ends of the first flexural member 120c along a direction MADa of the first long axis MAa, and a second end portion 13a and a fourth end portion 13b are defined at both, e.g., opposite, ends of the second flexural member 130c along a direction MADb of the second long axis MAb.

The first roller 121a may be disposed at the third end portion 12b and coupled with the first flexural member 120c, and the second roller 131a may be disposed at the fourth end portion 13b and coupled to the second flexural member 130c. The first and second rollers 121a and 131a may contact the flexible display panel 110 (refer to FIG. 6). When the flexible display panel 110 (refer to FIG. 6) moves, the first and second rollers 121a and 131a may be rotated. When the first and second rollers 121a and 131a are rotated, a frictional force between the flexible display panel 110 (refer to FIG. 6) and each of the first and second rollers 121a and 131a may be reduced. Thus, the flexible display panel 110 (refer to FIG. 6) may be easily exposed to the outside of the housing 200 (refer to FIG. 6).

Figure 8:
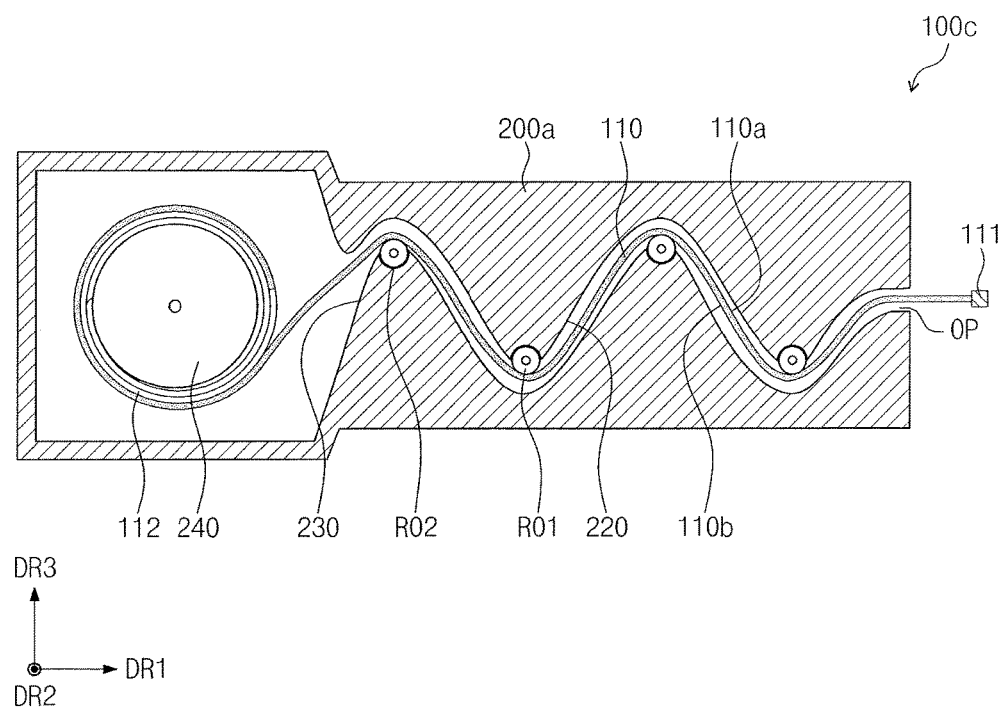
FIG. 8 illustrates a cross-sectional view of a rollable display device according to another exemplary embodiment.

FIG. 8 illustrates a cross-sectional view of a rollable display device 100c according to another exemplary embodiment.

Referring to FIG. 8, the rollable display device 100c may include a flexible display panel 110, a housing 200a, and a reel core 240.

The reel core 240 may be disposed inside the housing 200a. The reel core 240 may have a cylindrical shape elongated in the second direction DR2. The reel core 240 may be rotated and the flexible display panel 110 may be rolled around the reel core 240.

In the present exemplary embodiment, a connection part 112 may be disposed in the housing 200a to connect the reel core 240 and the flexible display panel 110. The connection part 112 may be connected to the reel core 240 and may be inside the housing 200a when the flexible display panel 110 is completely exposed to the outside of the housing 200a.

The housing 200a may include a first flexural part 220, a second flexural part 230, and an opening OP.

The flexible display panel 110 may be exposed to the outside of the housing 200a through the opening OP, and the opening OP may extend along the second direction DR2.

The first and second flexural parts 220 and 230 may be disposed in the housing 200a. For example, the first flexural part 220, the second flexural part 230, and the reel core 240 may be sequentially arranged along the first direction DR1 in a direction extending away from the opening OP.

The first and second flexural parts 220 and 230 may be formed on inner surfaces of the housing 200a to have a mountain or sawtooth shape. In an implementation, the first and second flexural parts 220 and 230 may have complementary, interengaging sawtooth shapes. In an implementation, the first and second flexural parts 220 and 230 may be alternately arranged twice along the direction extending away from the opening OP. In an implementation, the first and second flexural parts 220 and 230 may be alternately arranged one or three times, or more.

The first flexural part 220 may contact a first surface 110a of the flexible display panel 110 to bend the flexible display panel 110, and the second flexural part 230 may contact a second surface 110b of the flexible display panel 110 to bend the flexible display panel 110. Accordingly, when the flexible display panel 110 is rolled and kept in the housing 200a, at least a portion of the flexible display panel may have a wave shape elongated along the first direction DR1. As a result, when the flexible display panel 110 is kept inside the housing 200a for a long time without use, deformation of the flexible display panel 110 in the rolled shape may be prevented.

In an implementation, the rollable display panel 110c may include a first roller RO1 coupled with the first flexural part 220, and a second roller RO2 coupled with the second flexural part 230. The first roller RO1 may be disposed on a surface of the first flexural part 220, which surface contacts the flexible display panel 110, and the second roller RO2 may be disposed on a surface of the second flexural part 230, which surface contacts the flexible display panel 110.

In an implementation, the first and second rollers RO1 and RO2 may be respectively disposed at positions, at which slopes of the first and second flexural parts 220 and 230 are varied, e.g., where the sloped portions of the flexural parts meet or apexes of the sawteeth. In an implementation, the first and second rollers RO1 and RO2 may be disposed on a surface that contacts the flexible display panel 110, in addition to the positions at which slopes of the first and second flexural parts 220 and 230 are varied or meet. In an implementation, the first and second rollers RO1 and RO2 may be omitted.

The first and second rollers RO1 and RO2 may be rotated, and a frictional force between the flexible display panel 110 and the first flexural part 220 and between the flexible display panel 110 and the second flexural part 230 may be reduced when the flexible display panel 110 is pulled to be exposed to the outside of the housing 200a or rolled back into the housing 220a. Thus the flexible display panel 110 may be easily exposed to the outside of the housing 200a.

According to the present exemplary embodiment, the flexible display panel 110 may easily move over the first and second rollers RO1 and RO2, and a radius of curvature of the first and second flexural parts 220 and 230 may be reduced. Accordingly, a distance between the first flexural part 220 and the second flexural part 230 adjacent to the first flexural part 220 may be reduced, and a length in the first direction DR1 of the housing 200a may be reduced.

By way of summation and review, a rollable display device may have advantages such as a wide display area and a superior transportability.

A rollable display device may include a housing and a flexible display panel rolled into the housing. Extreme stress may be applied to portions of the flexible display panel while the flexible display panel is rolled into the housing, and defects in pixels arranged in the portions of the flexible display panel may occur.

The embodiments may provide a rollable display device having improved display quality.

The embodiments may provide a rollable display device capable of preventing a flexible display panel rolled and kept inside a housing from being deformed.

According to the above, although the flexible display panel may be kept inside a housing for a long time without use, deformation of the flexible display panel may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A rollable display device, comprising:
a flexible display panel that displays an image, the flexible display panel including a first surface and a second surface opposite to the first surface;
a housing inside which the flexible display panel is rolled and accommodated;
a first flexural member in the housing, the first flexural member contacting the first surface of the flexible display panel to bend the first surface;
a second flexural member in the housing and spaced apart from the first flexural member in a first direction, the second flexural member contacting the second surface of the flexible display panel to bend the second surface; and
a reel core in the housing and spaced apart from the first flexural member in the first direction such that the second flexural member is between the reel core and the first flexural member, wherein the flexible display panel is rollable around the reel core,
wherein:
each of the first and second flexural members has a substantially elliptical cylindrical shape that is elongated in a second direction, the second direction being substantially orthogonal to the first direction,
a cross section of each of the first and second flexural members taken along a direction substantially parallel to the first direction has a substantially elliptical shape,
the cross section of the first flexural member has a first long axis, and
the cross section of the second flexural member has a second long axis, the first long axis having a length smaller than a length of the second long axis.

2. The rollable display device as claimed in claim 1, further comprising:
first rollers coupled with the first flexural member, the first rollers being spaced apart from each other in a direction of the first long axis of the first flexural member; and
second rollers coupled with the second flexural member, the second rollers being spaced apart from each other in a direction of the second long axis of the second flexural member.

3. The rollable display device as claimed in claim 1, wherein:
the first flexural member is rotatable with respect to a rotational axis at a center of the first long axis, and
the second flexural member is rotatable with respect to a rotational axis at a center of the second long axis.

4. The rollable display device as claimed in claim 3, wherein a distance between the center of the first long axis and the center of the second long axis is greater than a sum of a half of the length of the first long axis and a half of the length of the second long axis.

5. The rollable display device as claimed in claim 1, wherein the first and second flexural members are rotatable such that the first and second long axes are substantially parallel to the first direction when the flexible display panel is exposed to the outside of the housing.

6. The rollable display device as claimed in claim 5, further comprising:
a first restoring member coupled with the first flexural member, the first restoring member having an elasticity to rotate the first flexural member; and
a second restoring member coupled with the second flexural member, the second restoring member having an elasticity to rotate the second flexural member,
wherein the first and second flexural members are rotatable by the first and second restoring members rotate in response to the elasticity of the first and second restoring members such that the first and second long axes of the first and second flexural members are arranged substantially parallel to a third direction that is substantially orthogonal to the first and second directions when the flexible display panel is accommodated the housing.

7. The rollable display device as claimed in claim 5, wherein the first and second flexural members are rotatable in different directions.

8. The rollable display device as claimed in claim 1, wherein:
the housing includes an opening therethrough to expose the flexible display panel to the outside thereof, and
the first flexural member, the second flexural member, and the reel core are sequentially arranged in a direction extending inwardly from the opening.

9. The rollable display device as claimed in 8, further comprising a connection part connecting the flexible display panel to the reel core, wherein the image is not displayed in the connection part.

10. The rollable display device as claimed in claim 9, wherein the connection part is inside the housing when the flexible display panel is completely exposed at the outside of the housing.

11. A rollable display device, comprising:
a flexible display panel that displays an image, the flexible display panel including a first surface and a second surface opposite to the first surface;
a housing inside which the flexible display panel is rolled and accommodated;
a first flexural member in the housing, the first flexural member contacting the first surface of the flexible display panel to bend the first surface;
a second flexural member in the housing and spaced apart from the first flexural member in a first direction, the second flexural member contacting the second surface of the flexible display panel to bend the second surface; and
a reel core in the housing and spaced apart from the first flexural member in the first direction such that the second flexural member is between the reel core and the first flexural member, wherein the flexible display panel is rollable around the reel core,
wherein:
each of the first and second flexural members has a substantially elliptical cylindrical shape that is elongated in a second direction, the second direction being substantially orthogonal to the first direction,
a cross section of each of the first and second flexural members taken along a direction substantially parallel to the first direction has a substantially elliptical shape,
the cross section of the first flexural member has a first long axis, and
the cross section of the second flexural member has a second long axis, and
wherein:
the first flexural member is rotatable about a rotational axis that is at a first end of the first long axis, and
the second flexural member is rotatable about a rotational axis that is at a second end of the second long axis.

12. The rollable display device as claimed in claim 11, wherein the first long axis has a length that is the same as a length of the second long axis.

13. The rollable display device as claimed in claim 12, wherein a distance between the first end of the first flexural member and the second end of the second flexural member is greater than the length of the first long axis.

14. The rollable display device as claimed in claim 11, wherein the first and second flexural members are rotatable in different directions.

15. The rollable display device as claimed in claim 10, further comprising a first roller and a second roller, wherein:
the first flexural member includes a third end spaced apart from the first end in a first long axis direction,
the second flexural member includes a fourth end spaced apart from the second end in a second long axis direction,
the first roller is disposed at the third end and is coupled with the first flexural member, and
the second roller is disposed at the fourth end and is coupled with the second flexural member.

16. A rollable display device, comprising:
a flexible display panel that displays an image, the flexible display panel including a first surface and a second surface opposite to the first surface;
a housing accommodating the flexible display panel, the housing including an opening therethrough; and
a reel core in the housing, the first surface of the flexible display panel being rollable around the reel core,
wherein the housing includes:
a first flexural part contacting the first surface of the flexible display panel to bend the flexible display panel, a first roller being coupled with the first flexural part, the first roller being on a surface of the first flexural part and contacting the flexible display panel, and
a second flexural part contacting the second surface of the flexible display panel to bend the flexible display panel, a second roller being coupled with the second flexural part, the second roller being on a surface of the second flexural part and contacting the flexible display panel, and
wherein the first flexural part, the second flexural part, and the reel core are sequentially arranged in a first direction extending inwardly from the opening.

17. The rollable display device as claimed in claim 16, further comprising a connection part connecting the flexible display panel to the reel core, wherein the image is not displayed in the connection part.

\* \* \* \* \*